United States Patent
Rahimo et al.

(10) Patent No.: US 11,404,542 B2
(45) Date of Patent: Aug. 2, 2022

(54) TRENCH PLANAR MOS CELL FOR TRANSISTORS

(71) Applicant: mqSemi AG, Zug (CH)

(72) Inventors: Munaf Rahimo, Gaensbrunnen (CH); Iulian Nistor, Niederweningen (CH)

(73) Assignee: mqSemi AG, Zug (CH)

( * ) Notice: Subject to any disclaimer, the term of this patent is extended or adjusted under 35 U.S.C. 154(b) by 0 days.

(21) Appl. No.: 17/174,995

(22) Filed: Feb. 12, 2021

(65) Prior Publication Data

US 2021/0257460 A1    Aug. 19, 2021

(30) Foreign Application Priority Data

Feb. 13, 2020 (GB) ..................... 2001950

(51) Int. Cl.
| | |
|---|---|
| *H01L 29/10* | (2006.01) |
| *H01L 29/06* | (2006.01) |
| *H01L 29/16* | (2006.01) |
| *H01L 29/40* | (2006.01) |
| *H01L 29/417* | (2006.01) |
| *H01L 29/423* | (2006.01) |
| *H01L 29/739* | (2006.01) |
| *H01L 29/78* | (2006.01) |

(52) U.S. Cl.
CPC ...... *H01L 29/1095* (2013.01); *H01L 29/0615* (2013.01); *H01L 29/1608* (2013.01); *H01L 29/407* (2013.01); *H01L 29/41766* (2013.01); *H01L 29/4236* (2013.01); *H01L 29/42376* (2013.01); *H01L 29/7397* (2013.01); *H01L 29/7813* (2013.01)

(58) Field of Classification Search
CPC ............. H01L 29/1095; H01L 29/0615; H01L 29/1608; H01L 29/407; H01L 29/41766; H01L 29/4236; H01L 29/42376; H01L 29/7397; H01L 29/7813
USPC .......................................................... 257/213
See application file for complete search history.

(56) References Cited

U.S. PATENT DOCUMENTS

| | | |
|---|---|---|
| 5,795,793 A | 8/1998 | Kinzer |
| 6,380,586 B1 | 4/2002 | Yoshikawa |
| 8,441,046 B2 | 5/2013 | Bobde |
| | (Continued) | |

FOREIGN PATENT DOCUMENTS

| | | |
|---|---|---|
| CN | 108428740 A | 8/2018 |
| WO | 2011157814 A2 | 12/2011 |

OTHER PUBLICATIONS

GB Search Report dated Sep. 29, 2020 for GB Application No. 2001950.1.

*Primary Examiner* — Igwe U Anya
(74) *Attorney, Agent, or Firm* — Tarolli, Sundheim, Covell & Tummino LLP

(57) ABSTRACT

A power transistor layout structure is described that includes a planar cell with a planar gate electrode forming an horizontal MOS channel, and a plurality of trench recesses with gate electrodes, which are arranged at various angles to the longitudinal direction of the planar cells. This cell concept can adopt both planar MOS channels, and Trench MOS channels in a single MOS cell structure. As an alternative, the planar cell gate electrode may be grounded. The device is easy to manufacture based on a self-aligned process with minimum number of masks, with the potential of applying additional layers.

17 Claims, 18 Drawing Sheets

(56) References Cited

U.S. PATENT DOCUMENTS

| | | | |
|---|---|---|---|
| 2013/0026537 A1* | 1/2013 | Rahimo | H01L 29/7395 |
| | | | 257/E29.197 |
| 2016/0027880 A1* | 1/2016 | Zeng | H01L 29/407 |
| | | | 257/330 |
| 2016/0163854 A1 | 6/2016 | Nishimura | |
| 2018/0261666 A1* | 9/2018 | Zeng | H01L 29/0878 |
| 2021/0202724 A1* | 7/2021 | Rahimo | H01L 29/0696 |

* cited by examiner

TRENCH PLANAR MOS CELL FOR TRANSISTORS

CROSS-REFERENCE TO RELATED APPLICATIONS

The present application claims priority to GB Patent Application No. 2001950.1 filed on 13 Feb. 2020. The entirety of this application is hereby incorporated by reference for all purposes.

FIELD OF THE INVENTION

The invention relates to the field of semiconductor devices, in particular power semiconductors. Power semiconductor devices that are able to withstand a blocking voltage of several hundred Volts at high current rating are typically implemented as vertical or lateral structures, wherein the semiconductor substrate is based for example on a semiconducting material such as silicon (Si) or silicon carbide (SiC) or diamond or gallium oxide (Ga2O3) or gallium nitride (GaN) or zinc oxide (ZnO).

BACKGROUND

Figure 1A:
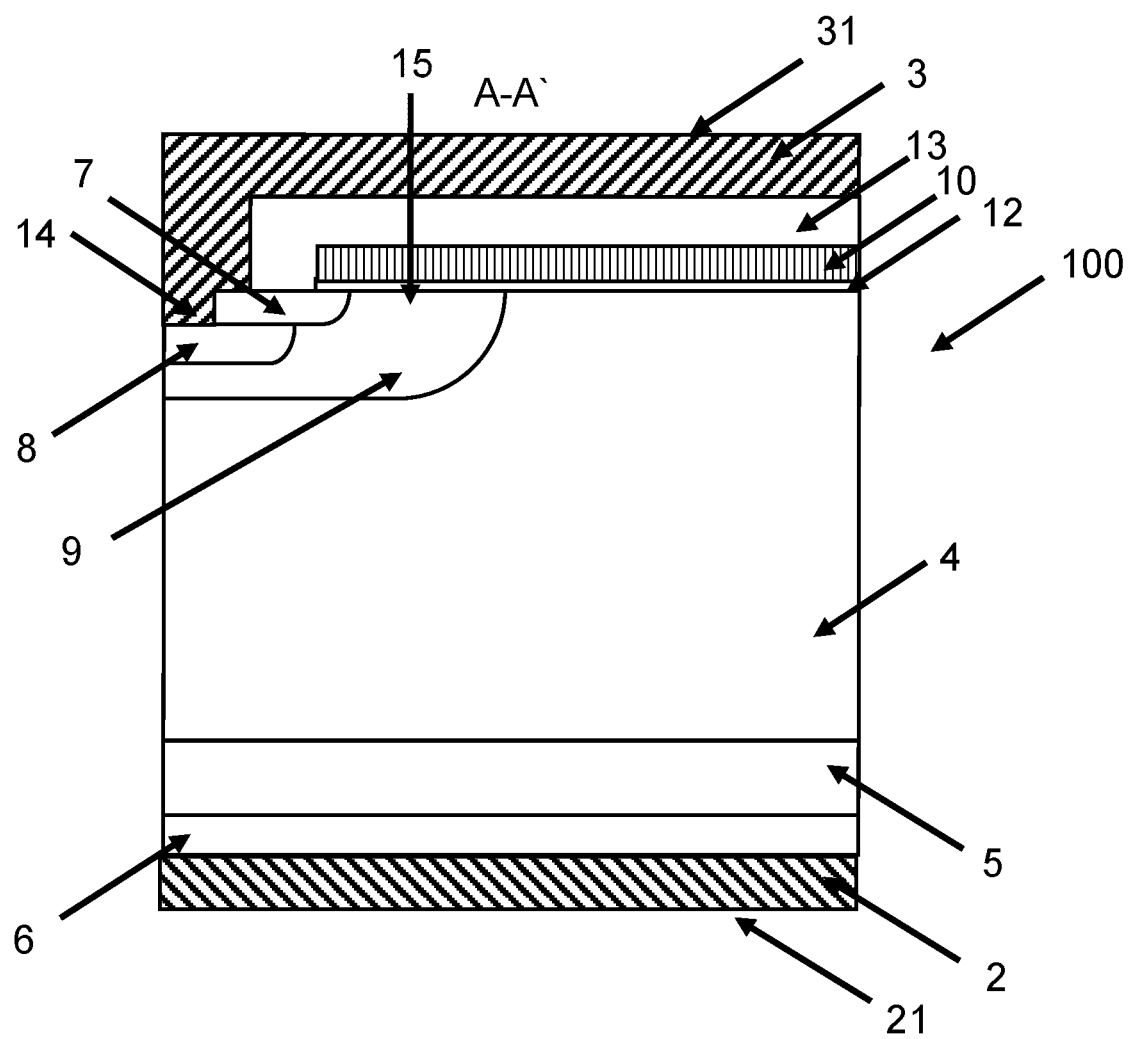
Figure 1B:
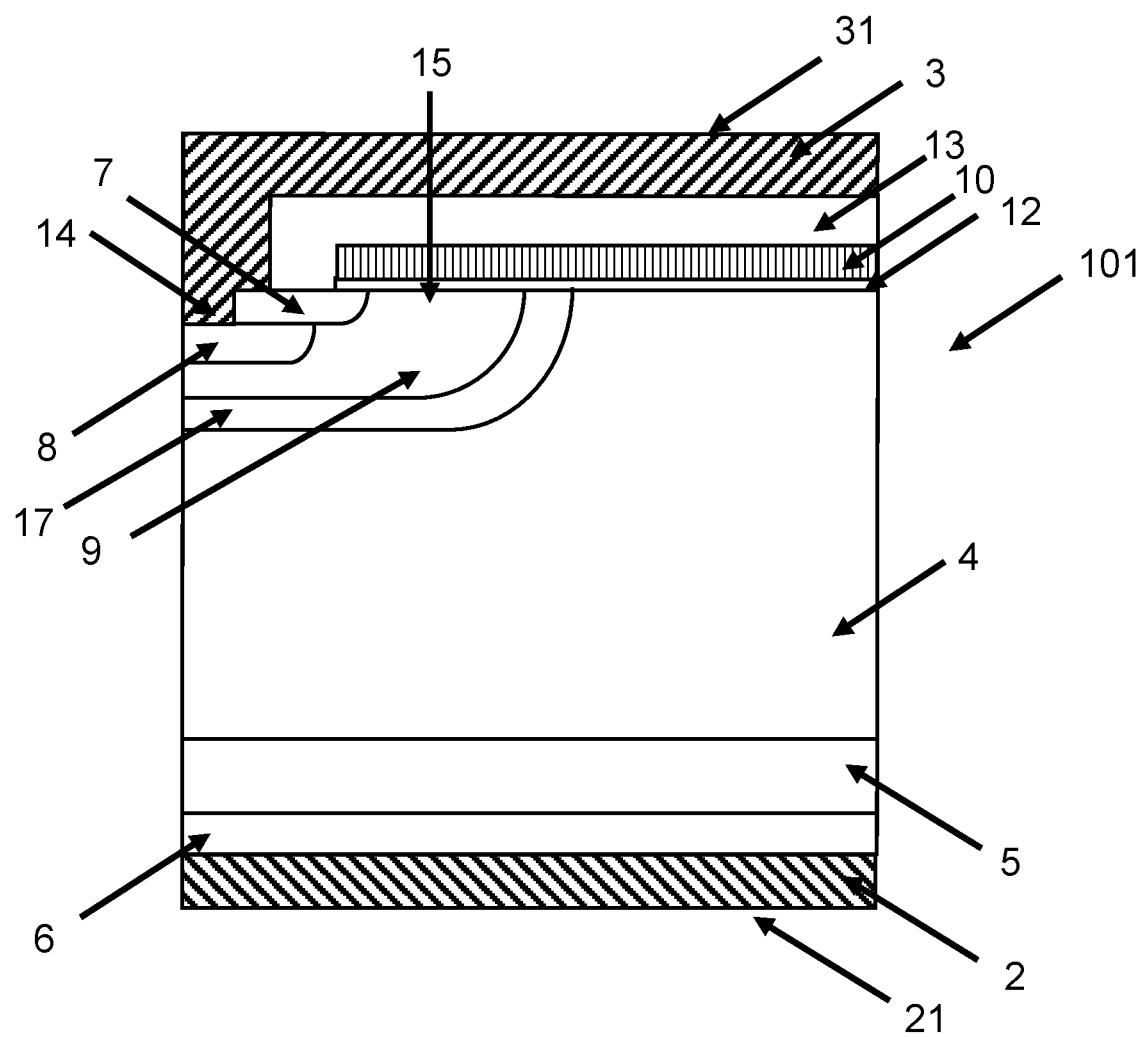
Figure 2:
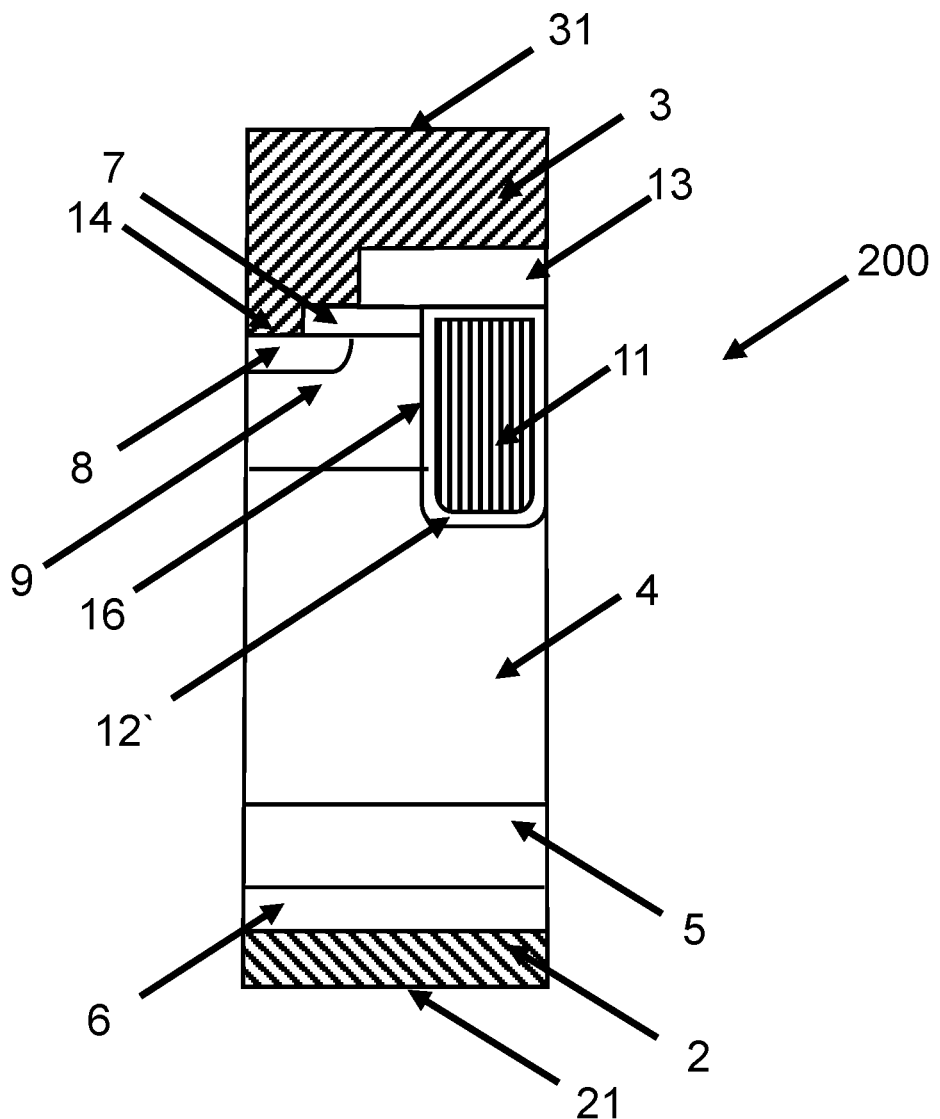

Planar and Trench MOS transistor cell designs exhibit a number of advantages and disadvantages for IGBT and MOSFET designs. For IGBTs, typical Planar and Trench designs are shown in FIGS. 1A and 2. Both designs can incorporate an enhancement n-type layer for improved excess carrier storage as shown in FIG. 1B for a planar structure.

FIG. 1A shows a prior art IGBT with planar gate electrodes in accordance to U.S. Pat. No. 5,795,793, for example. The IGBT (100) is a device with a four-layer structure, which are arranged between an emitter electrode (3) on an emitter side (31) and a collector electrode (2) on a collector side (21), which is arranged opposite of the emitter side (31). An (N-) doped drift layer (4) is arranged between the emitter side (31) and the collector side (21). A P-doped planar base layer (9) is arranged between the drift layer (4) and the emitter electrode (3). A planar N-doped source region (7) is arranged on the emitter side (31) embedded into the planar base layer (9) and contact opening (14) to the emitter electrode (3). In addition, a planar P-doped layer (8) is arranged on the emitter side (31) below region (7) and embedded into the planar base layer (9), and a contact opening (14) through region (7) and extending to region (8) is formed for the emitter electrode (3).

A planar gate electrode (10) is arranged on top of the emitter side (31). The planar gate electrode (10) is electrically insulated from the planar base layer (9), the planar source region (7) and the drift layer (4) by a planar insulating layer (12). There is a further insulating layer (13) arranged between the planar gate electrode (10) and the emitter electrode (3).

The planar design provides good blocking capability due to low peak fields at the cell, and in between the cells. The planar design can also provide good controllability and low switching losses and the cell densities in planar designs are easily adjusted for the required short circuit currents. Due to the fact that there exist few high peak electric fields in the gate oxide regions, the planar design offers good reliability with respect to parameter shifting during operation under high voltages. Also, the introduction of n-type enhanced layers (17) in planar cells has resulted in lower losses rivalling those achieved with trench designs as explained below.

The trench cell concept for a trench IGBT (200) shown in FIG. 2 offers a vertical MOS channel (16) which provides enhanced injection of electrons in the vertical direction and suffer from no drawbacks from charge spreading (JFET effect) near the cell. Therefore, the IGBT with trench gate (11) cells show much improved carrier enhancement for lower conduction losses. Due to the vertical channel design, the trench offers also less hole drain effect (PNP effect) due to the improved electron spreading out of the MOS channel. Modern trench designs adopting mesa widths (trench to trench distance) below 1 μm achieve very low conduction losses since closely packed trenches can provide a strong barrier to hole drainage. Matching such a performance with less complex processes can be of a great advantage. The accumulation layer at the bottom of the trench gate (11) offers strong charge enhancement for the PIN diode part. Hence wide and/or deep trenches show optimum performance. Furthermore, the trench design offers large cell packing density for reduced channel resistance.

Figure 3:
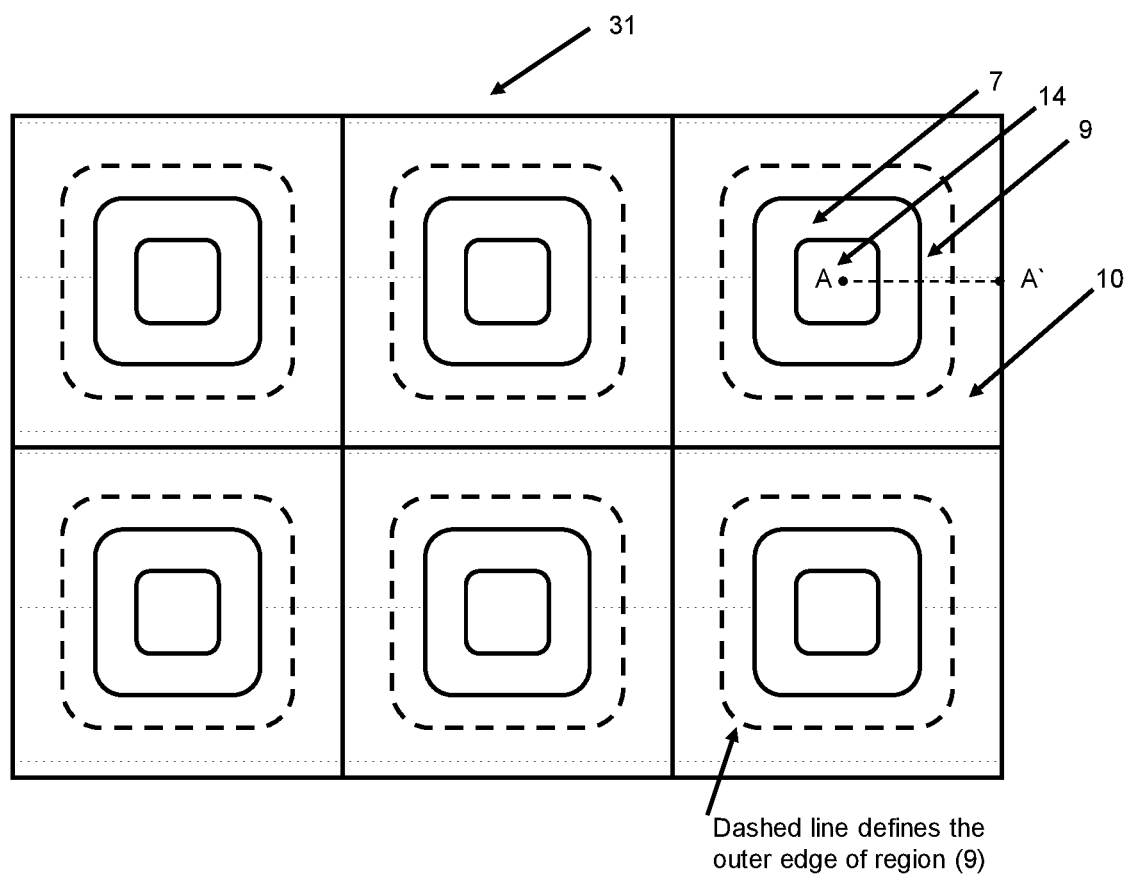
Figure 4:
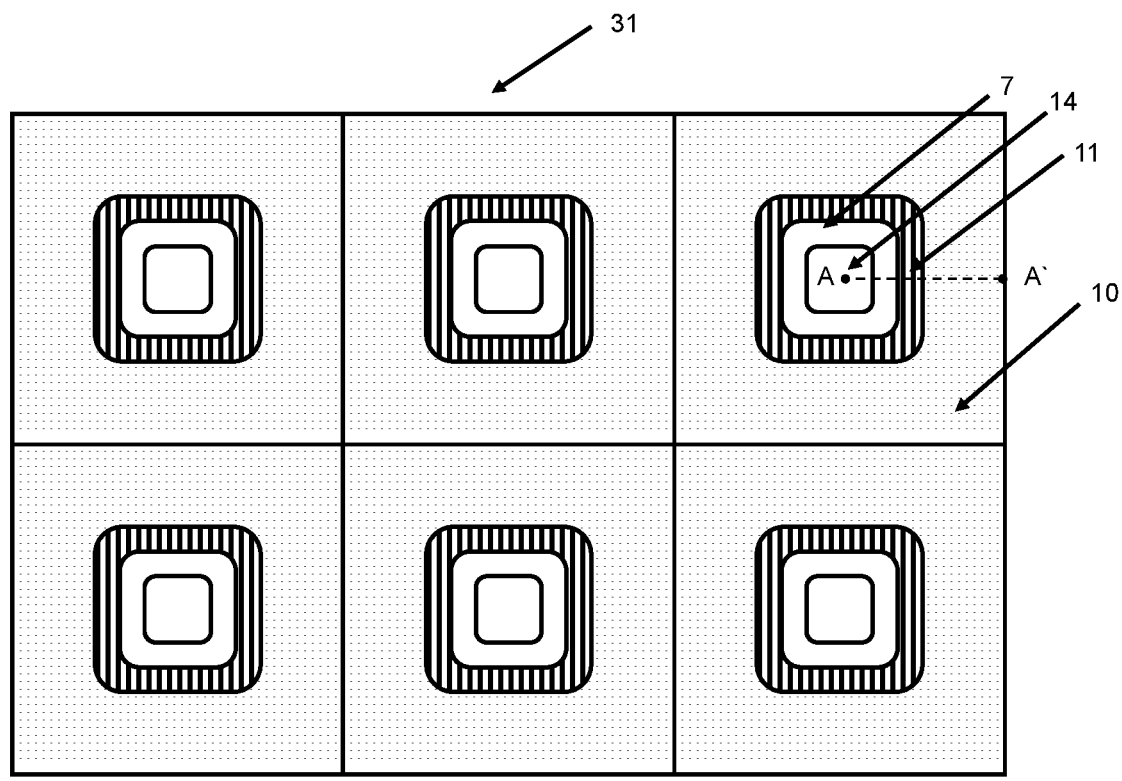

A top-down or plane view diagram of a typical cellular layout using a planar type structure is shown in FIG. 3 with the cross section along the cutline A-A' shown in FIG. 1. In this case, the cells are arranged in a repetitive, array-like arrangement, and are shaped as squares. Of course, due to imperfections in the manufacturing process, the actual shape of each transistor cell can also be slightly irregular. For the trench type structures, a similar typical plane view diagram is schematically shown in FIG. 4, with the cross section along the cutline A-A' shown in FIG. 5.

Figure 6A:
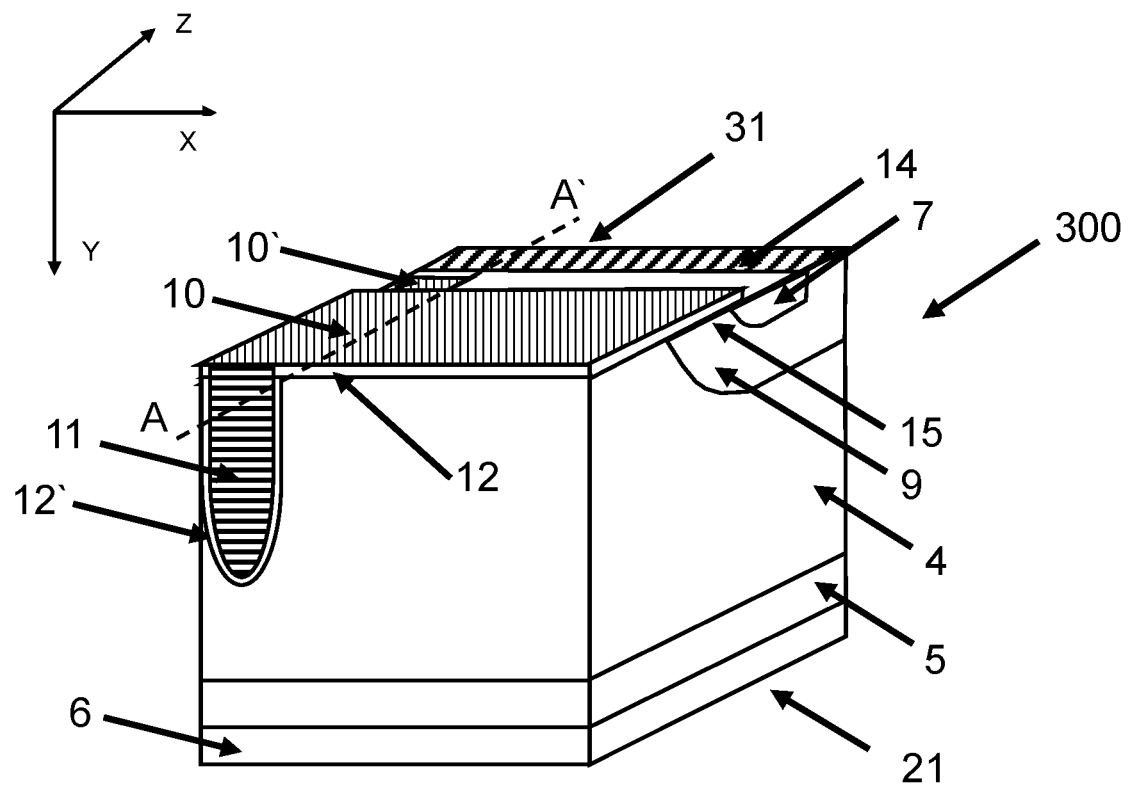
Figure 6B:
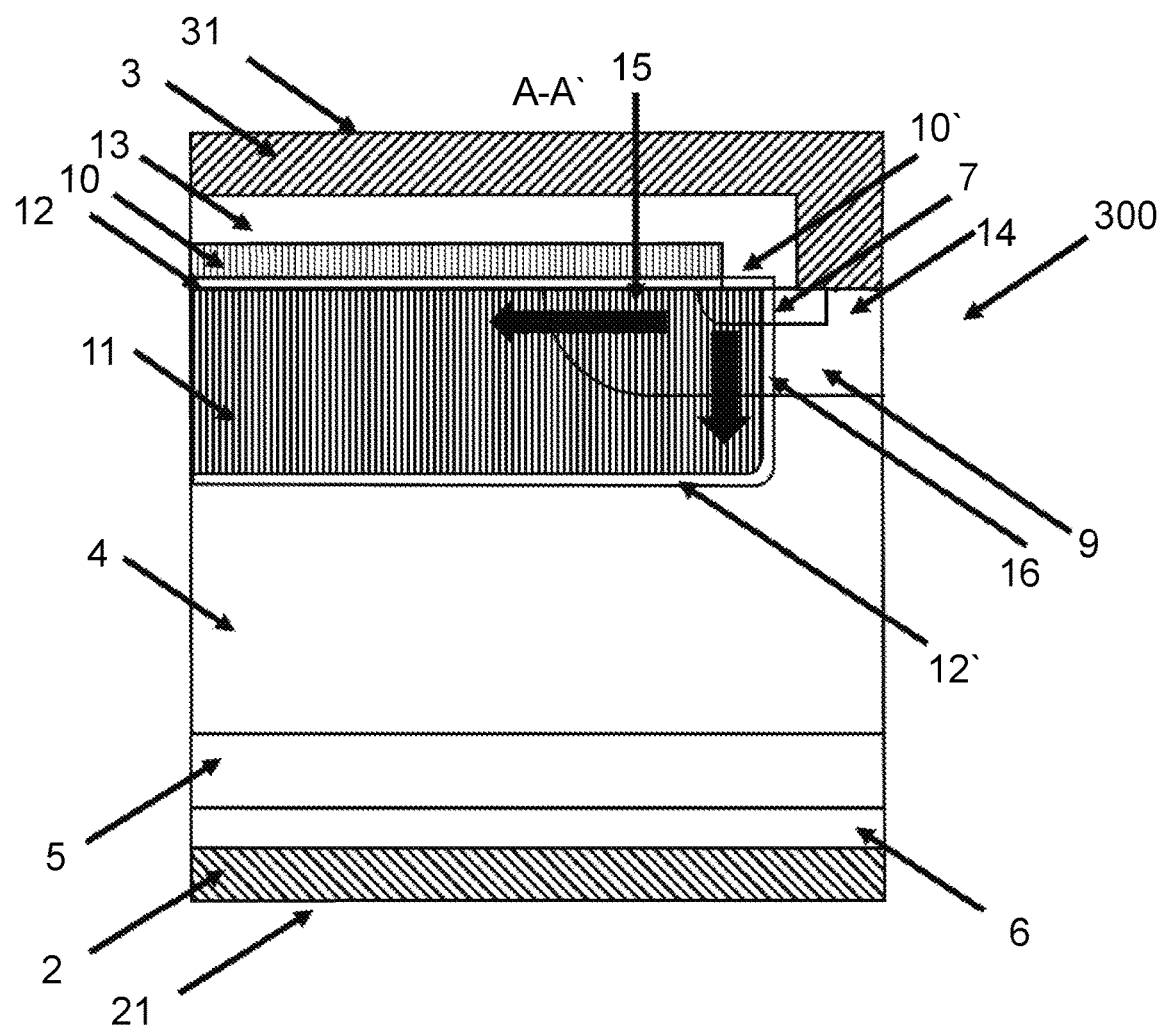

In a closely related prior art to the present invention, U.S. Pat. Nos. 6,380,586 and 8,441,046 describe a trench IGBT (300) where planar channels (15) are orthogonally positioned in relation to the trench regions as shown in FIG. 6A for an embodiment having a discontinued trench at the emitter contact (3). A continuous trench cutting through the emitter contact (3) was also described. The main feature of this structure is the trench channel (16) which will provide electron injection in both lateral and vertical dimensions at the trench wall as shown in the cross-section along the cutline A-A' as shown in FIG. 6B. Such a power transistor will have different MOS parameters such as the threshold voltage for the vertical and lateral channels. Furthermore, for the discontinued version, the trench MOS channel (16) at the trench periphery near (10') can become critical due to the sharp trench curvature in that region. Furthermore, in this prior art, the trench recesses are shaped as stripes. The design includes thus planar channel regions, and a plurality of trenches arranged orthogonally to the longitudinal plane of the planar cells. This results in an arrangement where the trenches are parallel with each other, thus the transversal separation between trenches is constant along their length. This is not possible to implement for a cellular layout.

It is desirable to find a new MOS cell design concept that can still benefit from the combination of the trench and planar MOS cell concepts while considering various types of cellular layouts for the power transistors.

SUMMARY

It may be an object of the present invention to provide a transistor cell layout for a power semiconductor device offering reduced on-state losses, low drainage of holes, stable gate parameters, improved blocking capability, and good controllability, such as an Insulated Gate Bipolar Transistor (IGBT) with improved electrical characteristics.

These objects may be met by the subject matter of the independent claims. Embodiments of the invention are described with respect to the dependent claims.

The problem is solved by the semiconductor device with the characteristics of claim 1.

The inventive power semiconductor cell layout includes layers of different conductivity types, which layers are arranged between an emitter electrode on an emitter side and a collector electrode on a collector side, which can be arranged opposite of the emitter side in the case of a vertical power semiconductor, but can also be arranged on the same emitter side in the case of lateral power semiconductors. The layers comprise, at a minimum:

a drift layer of a first conductivity type, which is arranged between the emitter side and the collector side, and a first base layer of a second conductivity type, which is arranged between the drift layer and the emitter electrode, and is structured according to a cellular layout (i.e. hexagonal, round, square shapes arranged in various configurations), and a source region of the first conductivity type, which is arranged at the emitter side embedded into the first base layer and contacts the emitter electrode, which source region has a higher doping concentration than the drift layer, and a second base layer of the second conductivity type, which is arranged at the emitter side embedded into the first base layer, extending towards the collector side beyond the source region and directly contacting the emitter electrode, which second base layer region has a higher doping concentration than the first base layer, and can also be structured according to the same cellular layout as the first base layer, and a first planar gate electrode, which is arranged on top of the emitter side abutting the source region, which first gate electrode is electrically insulated from the first base layer, the source region and the drift layer by a first insulating layer, an horizontal channel is formable between the emitter electrode, the first source region, the first base layer and the drift layer, and a plurality of second gate electrodes embedded in trench recesses abutting the source region, where each of the secondary gate electrodes is electrically insulated from the first base layer, second base layer, source region and the drift layer by a second insulating layer; a vertical channel can be formable on the trench side walls between the emitter electrode, the source region, the first base layer and the drift layer; and, optionally, an advanced enhancement layer of the first conductivity type, which is arranged between the drift layer and the first base layer, and completely surrounds the first base layer, which advanced enhancement layer region has a higher doping concentration than the drift layer, but a smaller doping concentration than the source region.

The second gate electrodes are formed in a manner such that the longitudinal orientation of their trench recesses is along either the sides or the diagonals of the polygonal shape defining the transistor cell. This is needed to maintain the symmetry of the cell, which may reduce the risk of unbalances (i.e., local variations) in the electric currents, and the electric field regions. Any trench recess within the same transistor cell, can be etched as one continuous section, or can be segmented i.e., interrupted along its longitudinal direction by regions where the drift layer is not removed/etched.

The inventive planar semiconductor cell layout integrates a Trench into a Planar MOS cell in order to gain the advantages of both designs in terms of reduced on-state losses, low drainage of holes, stable gate parameters, improved blocking and good controllability.

The new design offers a wide range of advantages both in terms of performance (reduced losses, improved controllability and reliability), and ease of processing with the potential of applying enhanced layer structures.

The inventive design can be applied to both IGBTs and MOSFETs based on silicon or wide bandgap materials such as silicon carbide (SiC). In particular, the use of a highly doped region of first conductivity type, manufactured, as per the embodiments of this invention, adjacent to the MOS channel, can be very beneficial in reducing the voltage drop in conduction mode for SiC MOSFET semiconductors.

Those skilled in the art will recognize additional features and advantages upon reading the following detailed description and upon viewing the accompanying drawings.

BRIEF DESCRIPTION

The embodiments of the invention will be explained in more detail in the following text with reference to the attached drawings, in which:

FIG. 1A: shows the cross section of a Planar MOS IGBT structure (prior art).

FIG. 1B: shows the cross section of an Enhanced Planar MOS IGBT structure (prior art).

FIG. 2: shows the cross section of a Trench MOS IGBT structure (prior art).

FIG. 3: shows a top down view of a cellular layout using a Planar MOS IGBT structure (prior art).

FIG. 4: shows a top down view of a cellular layout using a Trench MOS IGBT structure (prior art).

Figure 5:
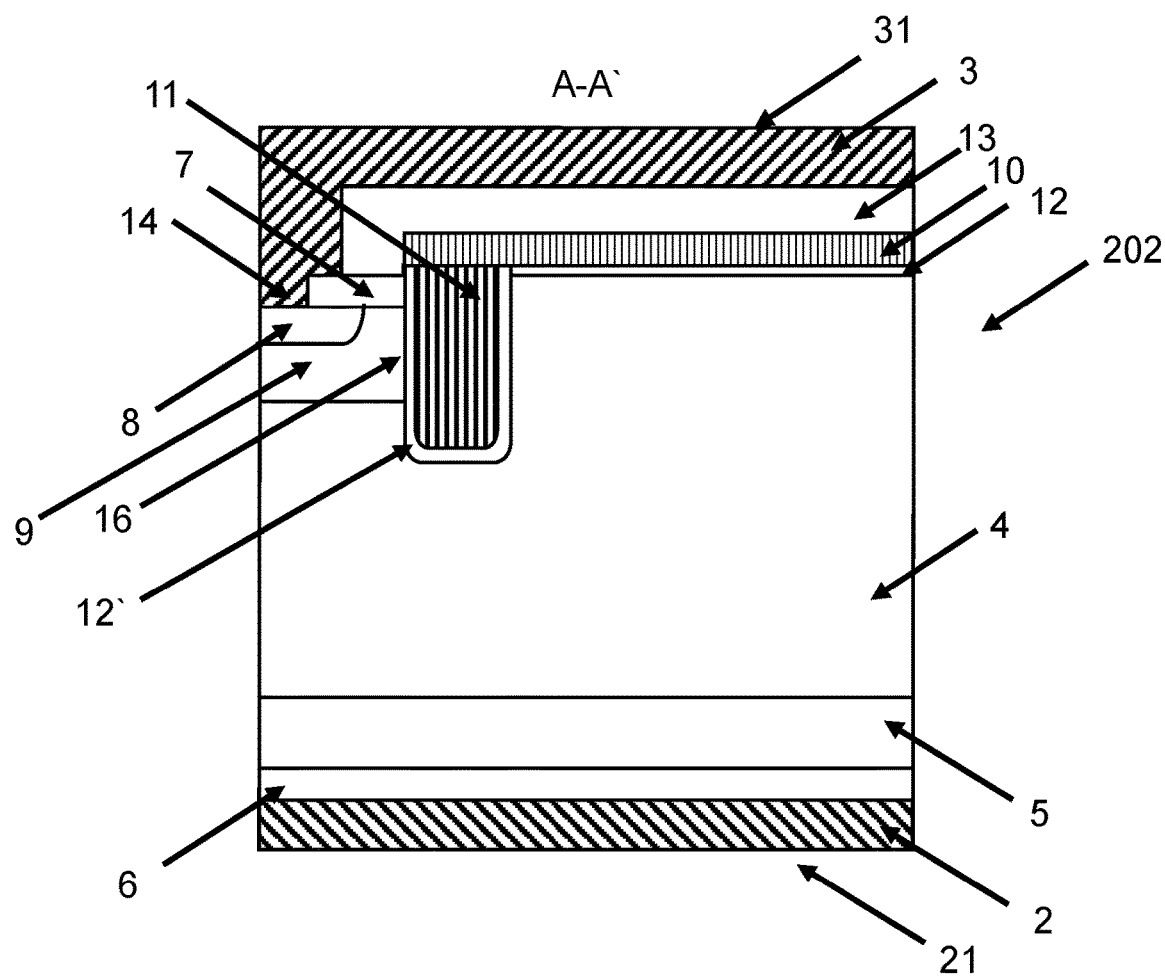

FIG. 5: shows a 3D view of Trench Planar MOS IGBT structure with trench gate electrodes orthogonal to the planar channels (prior art).

FIG. 6B: shows a cross section of Trench Planar MOS IGBT structure with orthogonal trench gate electrodes along the cut line A-A' in FIG. 6A indicating the current flow in conduction mode (prior art).

Figure 7A:
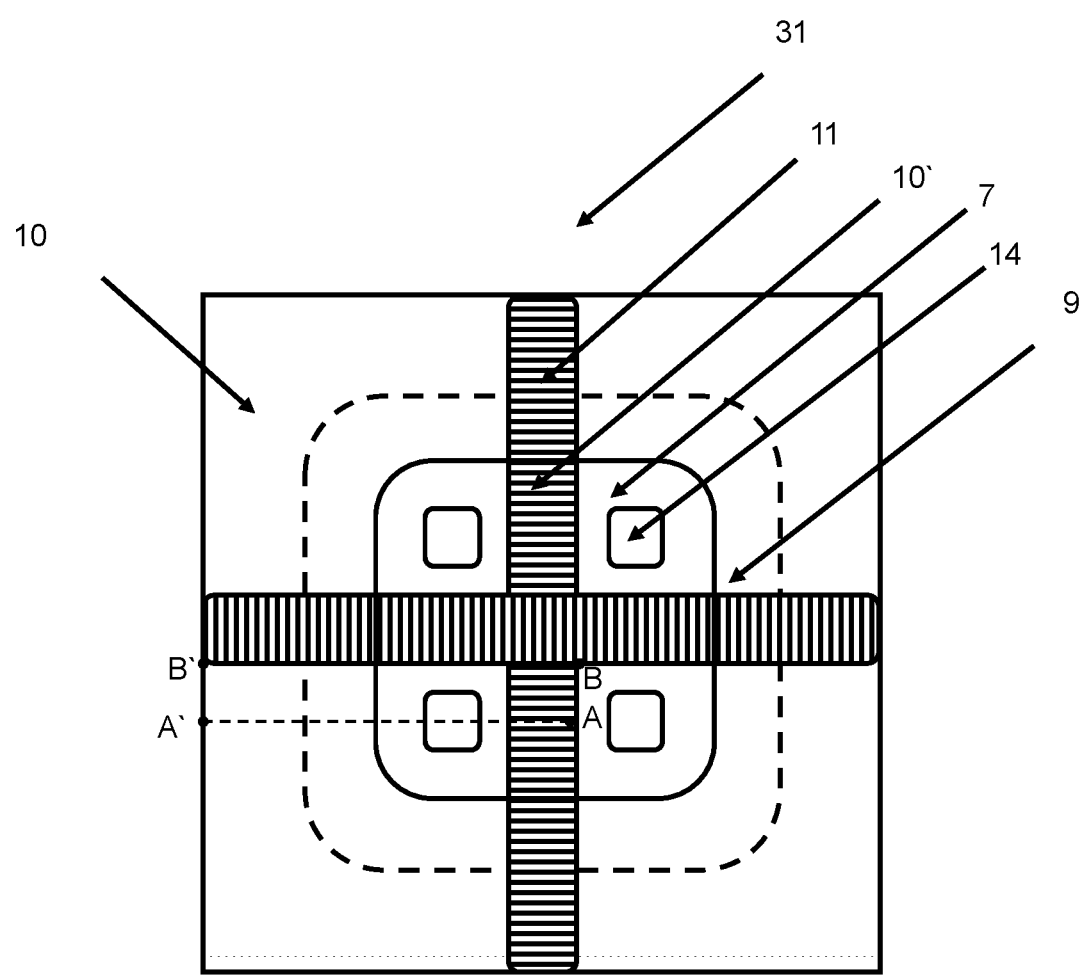

FIG. 7A: shows the top plane view of a first exemplary embodiment of a Trench Planar MOS IGBT cell layout with continuous second gate electrodes according to the invention.

Figure 7B:
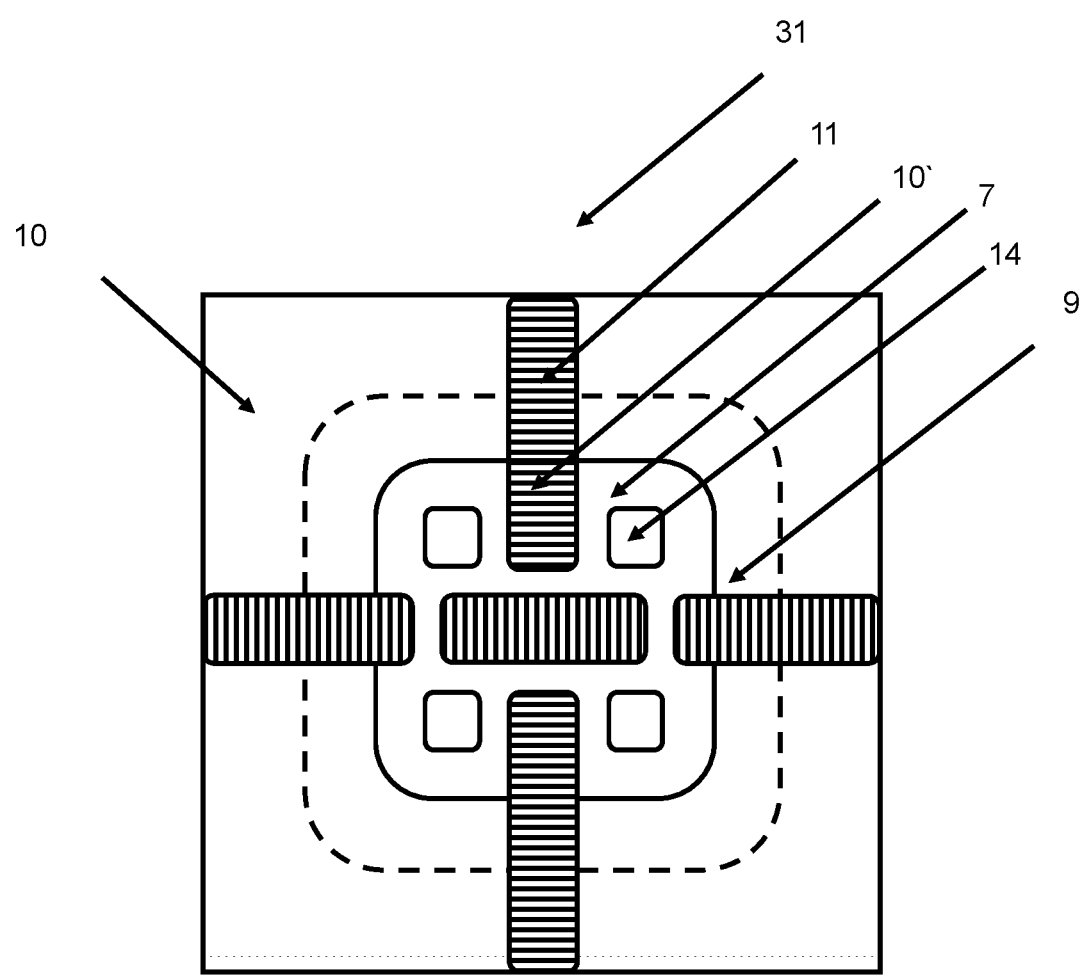

FIG. 7B: shows the top plane view of a second exemplary embodiment of a Trench Planar MOS IGBT cell layout with segmented second gate electrodes according to the invention.

Figure 8:
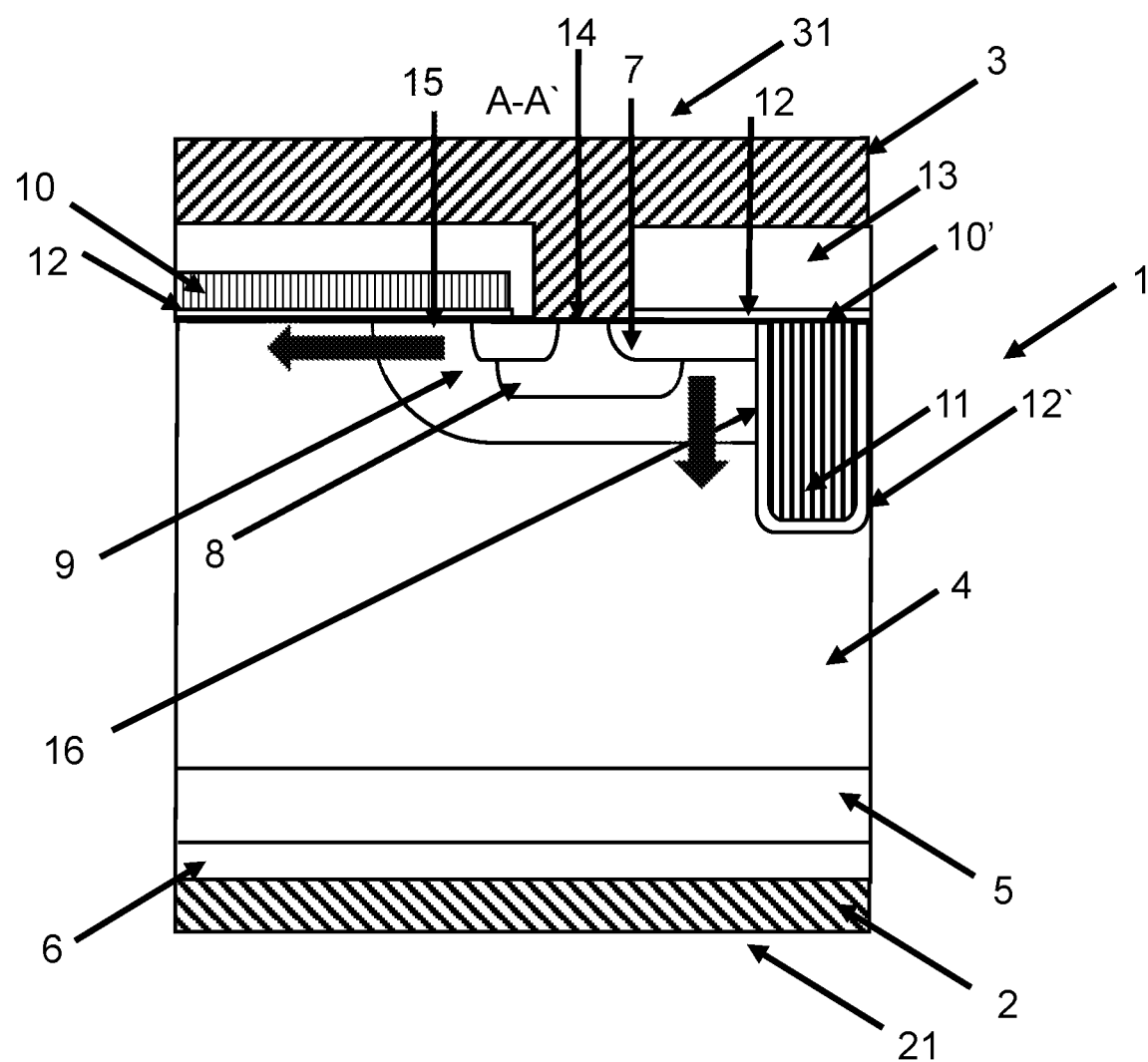

FIG. 8: shows a cross section of a first exemplary embodiment of Trench Planar MOS IGBT structure with orthogonal trench gate electrodes along the cut line A-A' in FIG. 7A indicating the current flow in conduction mode.

Figure 9:
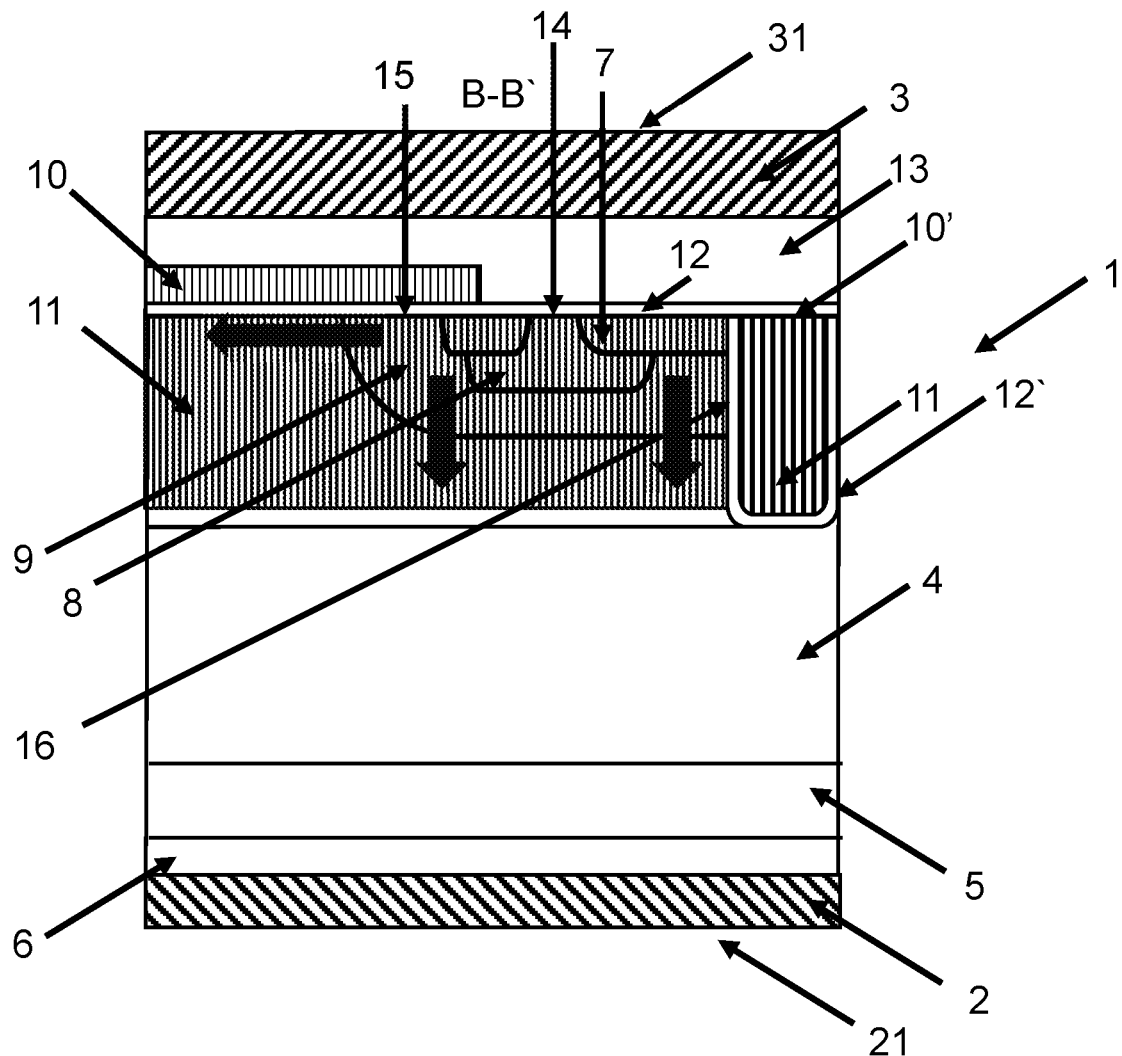

FIG. 9: shows a cross section of a first exemplary embodiment of Trench Planar MOS IGBT structure with orthogonal trench gate electrodes along the cut line B-B' in FIG. 7A indicating the current flow in conduction mode.

Figure 10:
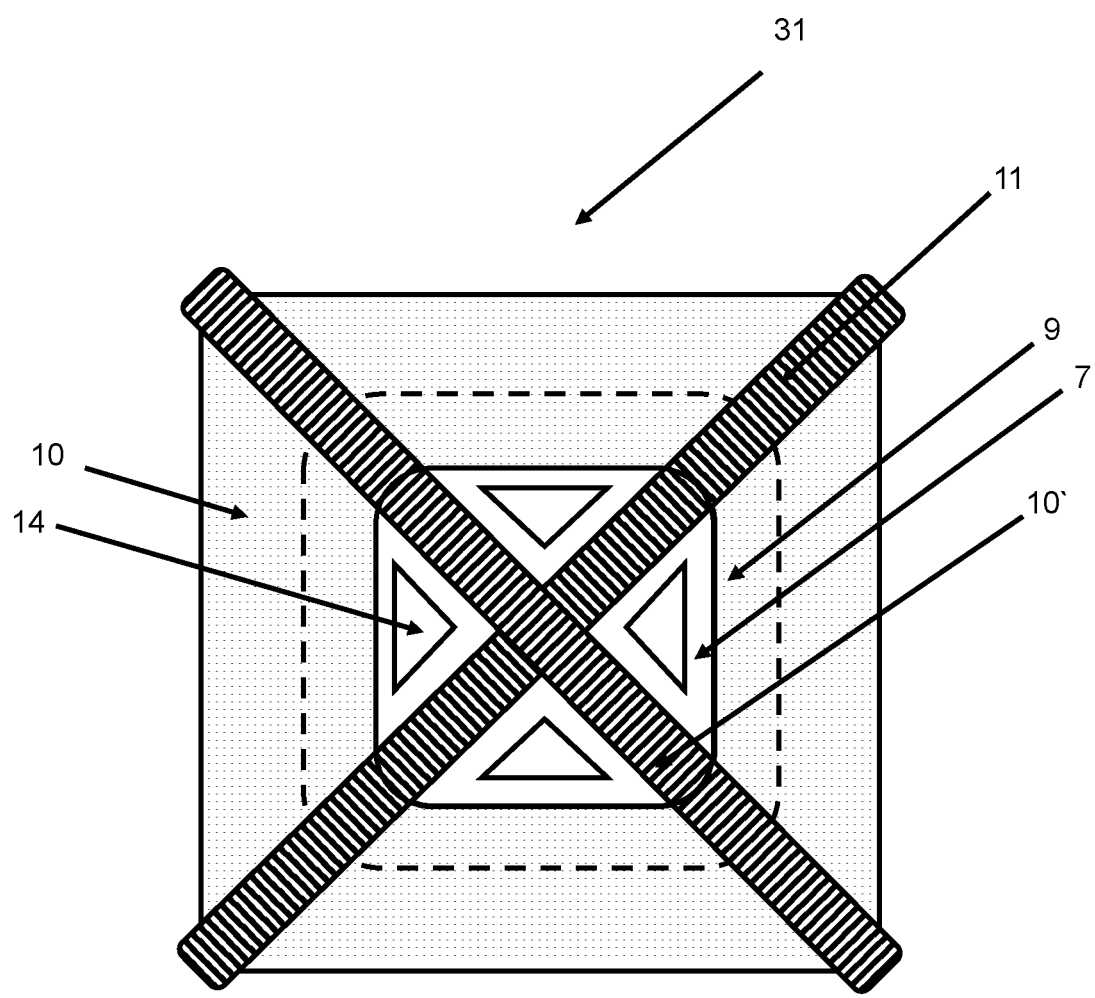

FIG. 10: shows the top plane view of a third exemplary embodiment of a Trench Planar MOS IGBT cell layout according to the invention.

Figure 11:
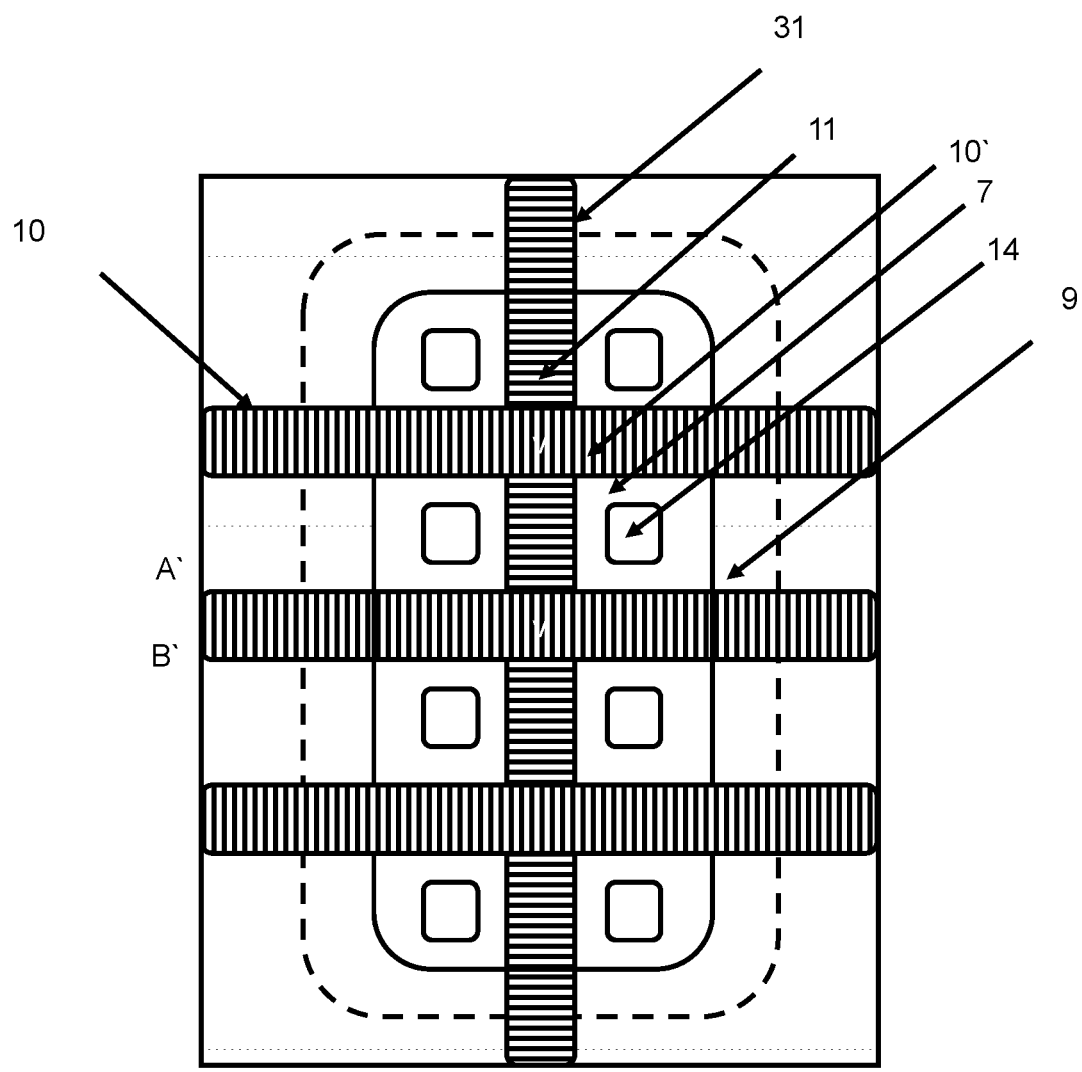

FIG. 11: shows the top plane view of a fourth exemplary embodiment of a Trench Planar MOS IGBT cell layout according to the invention.

Figure 12:
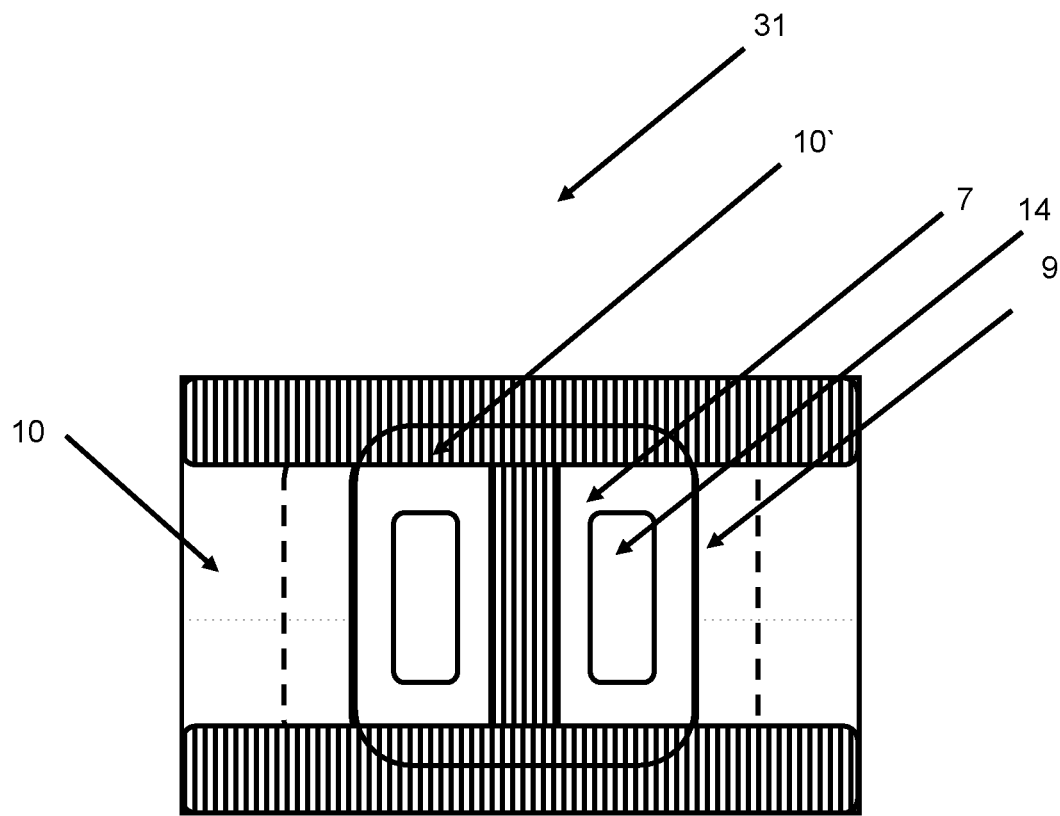

FIG. 12: shows the top plane view of a fifth exemplary embodiment of a Trench Planar MOS IGBT cell layout according to the invention.

Figure 13:
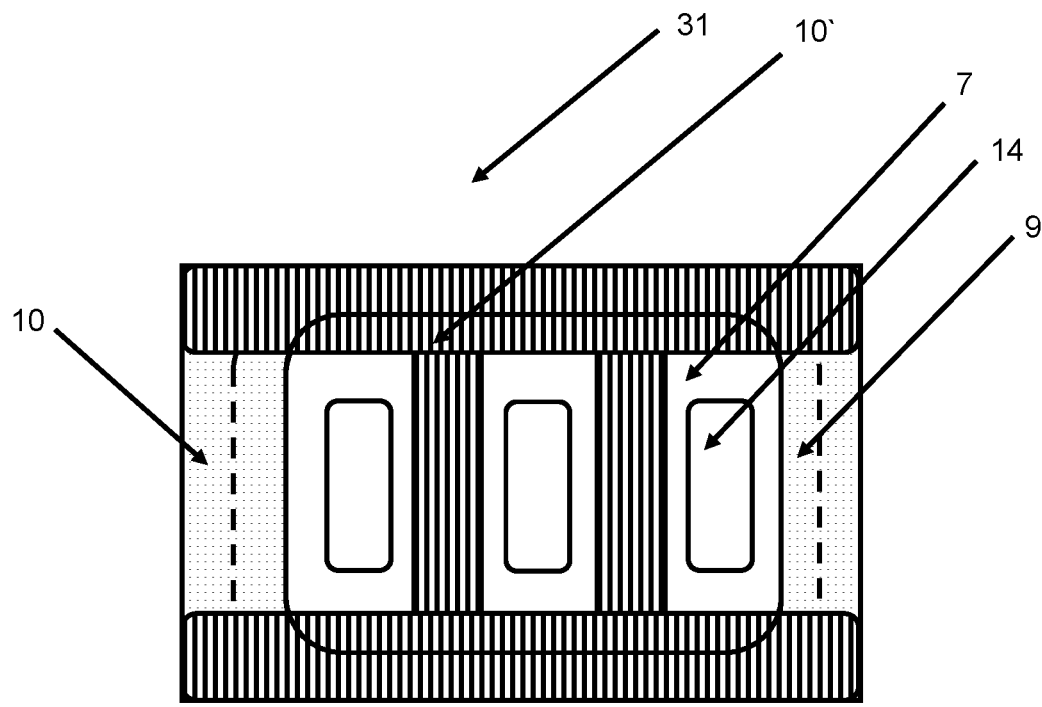

FIG. 13: shows the top plane view of a sixth exemplary embodiment of a Trench Planar MOS IGBT cell layout according to the invention.

Figure 14A:
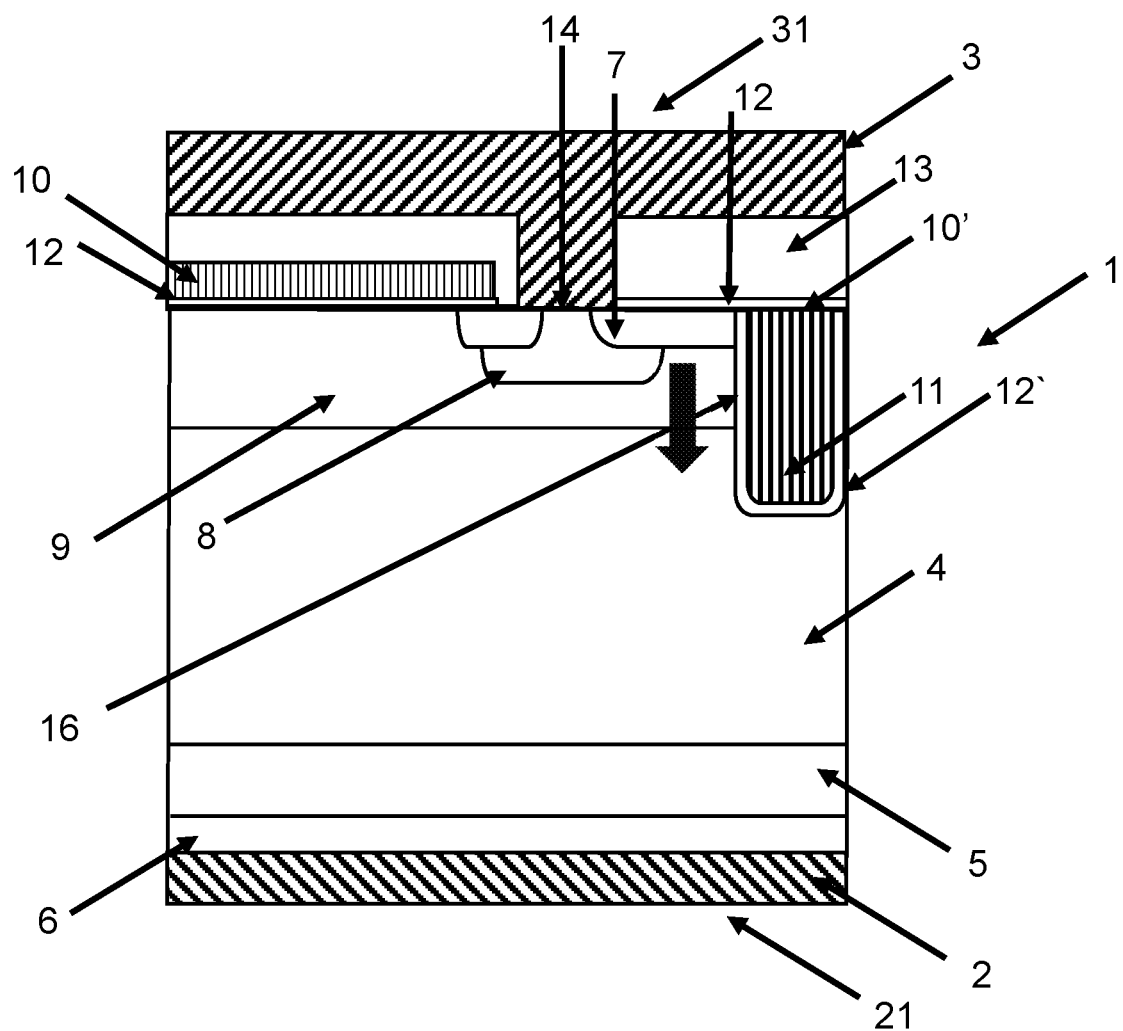

FIG. 14A: shows a cross section of a seventh exemplary embodiment of a Trench Planar MOS IGBT cell layout according to the invention.

Figure 14B:
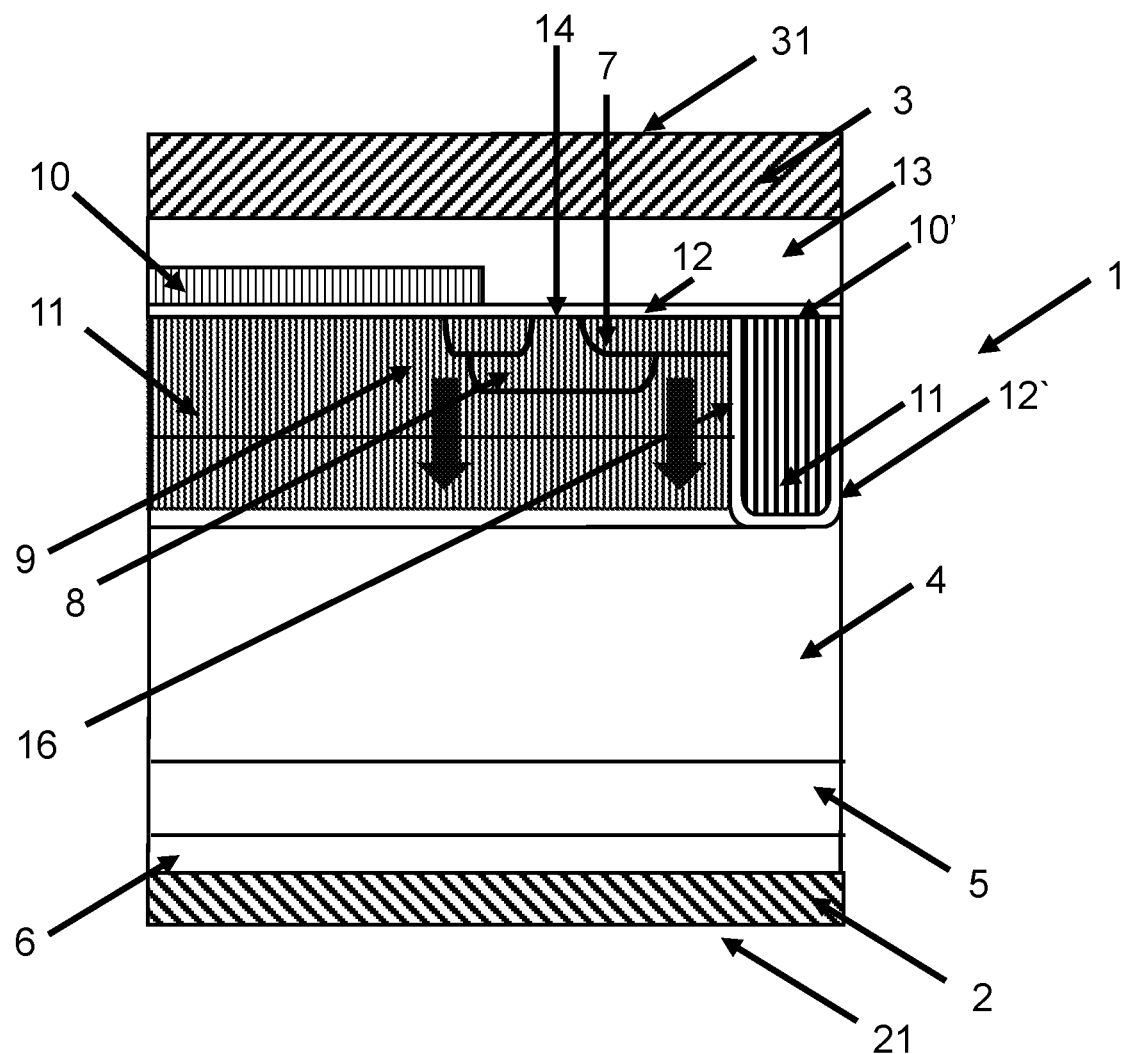

FIG. 14B: shows a cross section along the trench wall of the seventh exemplary embodiment of a Trench Planar MOS IGBT cell layout according to the invention.

Figure 15:
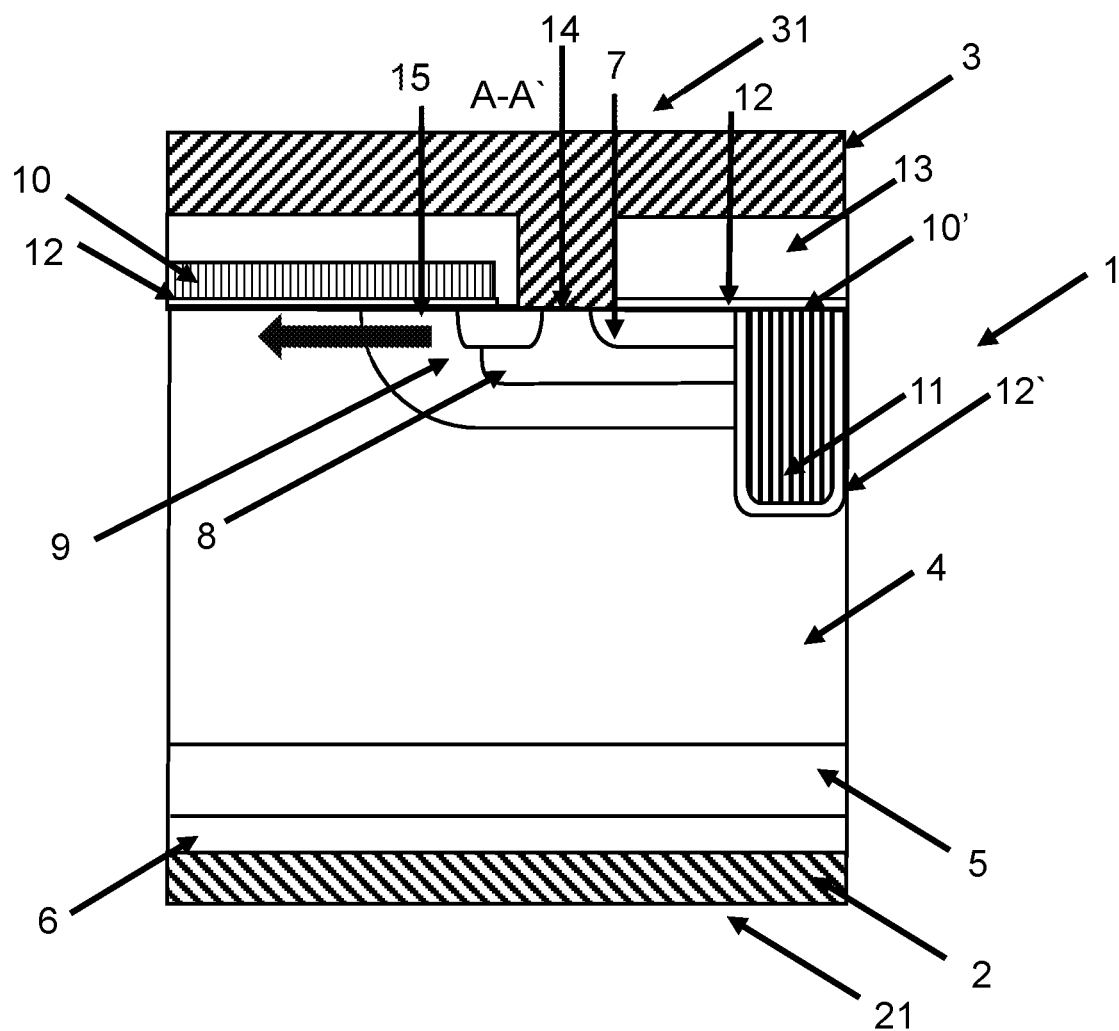

FIG. 15: shows a cross section of an eighth exemplary embodiment of a Trench Planar MOS IGBT cell layout according to the invention.

The reference symbols used in the figures and their meaning are summarized in the list of reference symbols. The drawings are only schematically and not to scale. Generally, alike or alike-functioning parts are given the same reference symbols. The described embodiments are meant as examples and shall not confine the invention.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation fo the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Reference will now be made in detail to various embodiments, one or more examples of which are illustrated in the figures. Each example is provided by way of explanation, and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appending claims. The drawings are not scaled and are for illustrative purposes only. For clarity, the same elements or manufacturing steps have been designated by the same references in the different drawings if not stated otherwise.

Unless otherwise defined, all terms (including technical and scientific terms) used herein have the same meaning as commonly understood by one of ordinary skill in the art to which example embodiments belong. It will be further understood that terms, e. g., those defined in commonly used dictionaries, should be interpreted as having a meaning that is consistent with their meaning in the context of the relevant art. However, should the present disclosure give a specific meaning to a term deviating from a meaning commonly understood by one of ordinary skill, this meaning is to be taken into account in the specific context this definition is given herein.

In this specification, N-doped is referred to as first conductivity type while P-doped is referred to as second conductivity type. Alternatively, the semiconductor devices can be formed with opposite doping relations so that the first conductivity type can be P-doped and the second conductivity type can be N-doped.

Specific embodiments described in this specification pertain to, without being limited thereto, insulated gate bipolar semiconductor devices.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e. g. "between" versus "directly between", "adjacent" versus "directly adjacent," etc.).

The polygon configurations of the transistor cell regions according to the first embodiment are best shown in FIG. 7A, which is first described. Referring to this figure, the top plane view of the transistor cell shows only the critical layers, and is depicting a manufacturing stage prior to the application of the dielectric layer (13) and of the emitter electrode layer (3). The transistor cell layout is depicted as a square shape in FIG. 7A, but can have any other polygonal shape such as hexagons, rectangles. triangles or even rounded shapes. Additionally, FIG. 7A depicts two second gate electrodes (11) formed in trench recesses, and a polygonal opening in the first planar gate electrode layer (10) that overlays a plurality of source regions (7) with contact openings (14), all these layers being formed on the emitter side (31) of the transistor. The two trench recesses are arranged orthogonal to each other, each of them parallel to one of the two main sides of the square cell. Other regular and irregular shapes such as hexagons, circles, or triangles could be used for the opening in the first gate electrode layer, or for the source regions and/or the contact openings. Irregular shapes (eg. elongated, or with jigsaw like sides) could be in-fact more realistically obtained as a result of variations in the actual manufacturing process.

To produce a fully functional transistor, a very large number of such cells are formed on the side (31) of the drift layer (4) and arranged in patterns similar to those depicted in FIGS. 3 and 4. For example, in a power semiconductor device having a surface dimension of the active area (i.e. surface area of the drift layer carrying electrical current in conduction mode) of about 10 by 10 mm, approximately 10,000 to 100,000 transistor cells may be formed. Each of the transistor cells may have a width measured perpendicularly to two opposing sides of the polygon of about 20 µm or less. The cells are spaced from one another by a distance of about 20 µm to 50 µm when measured between the adjacent straight sides of adjacent cells.

In FIG. 7A, the polygonal opening in the first planar gate electrode layer (10) is overlaying the similarly polygonal N type source regions (7) formed in a semiconductor drift layer or substrate (4). This layer can be an N type wafer of monocrystalline Silicon, or a wafer of monocrystalline Silicon or Silicon carbide or Gallium Nitride, or Aluminium Oxide, etc, which has a thin epitaxial region deposited thereon. All junctions are formed in the drift layer (4).

Further device details are depicted in the cross sections of FIGS. 8 and 9 along the cut lines A-A' and B-B' in the top down view diagram of FIG. 7A. By using suitable lithographical masks, a plurality of P type regions such as layers (8) and (9) are formed on the same emitter surface (31) of the semiconductor drift region (4), which layers are also generally polygonal in configuration (in a top plane view). It is important to mention that the second base layer (8) in FIG. 8 for example, can also be extended laterally to abut the second insulating layer (12') which will separate it from the second gate electrode (11). This will become important as discussed at a later point.

In FIGS. 7A, 8 and 9, it will be noted that the drift layer (4) is covered on the emitter side (31) with a least one oxide layer. This layer is more clearly shown in FIGS. 8 and 9 as the first insulating layer (12), which also extends in the trench recesses as second insulating layer (12'). The insulation layer (12) is provided with polygonal shaped openings immediately above polygonal shaped base layers (8) and (9). These openings have boundaries overlaying at least the N type source regions (7) and P type layer (9).

First and second gate electrodes (10) and (11) are also included in the device as shown in FIGS. 8 and 9. These layers may include a polysilicon grid with polysilicon sections which overlay the insulating layers (12) and (12'). It is critical to avoid any direct contact between the gate electrode layers (10) and (11), and the drift layer (4) or any of the layers (7), (8) and (9) in the transistor cell. Furthermore, the first and second gate electrodes can be directly connected to each other at the crossing points thereof, or some of them can be grounded or electrically floating.

A further insulating layer (13) is then found on the top of the drift layer (4), overlaying at a minimum the first and second gate electrodes (10) and (11). Layer (13) insulates these gate control electrodes from the emitter electrode (3) which is subsequently deposited over the entire emitter side (31). In FIG. 8, the emitter electrode is shown as conductive coating layer (3) which may be of any desired material, such as Aluminium. In some regions (10') along the trench recesses, the second gate electrodes (11) are not overlapped by the first gate electrodes (10), but only by the insulating layers (12) and (13).

In the case of an insulated gate bipolar transistor, the collector side (21) of the power device further includes an N-type buffer layer (5) and a P-type collector layer (6) as depicted in FIG. 8. The layers (5) and (6) could be omitted if a transistor is a unipolar transistor such as a JFET or MOSFET. Finally, a collector side electrode (2) is applied to the device on the collector side (21).

The resulting transistor cell 1 depicted as cross sections in FIGS. 8 and 9 is an N channel type device wherein both planar (15) and vertical (16) MOS channel regions are formed between each of the individual source regions (7) and the drift layer (4) upon the application of a suitable control voltage to the electrode gates (10) and (11).

In a further embodiment shown in FIG. 7B, some or all of the trench recesses embedding the second gate electrodes can be formed as segmented recesses instead of a continuous section, meaning that they are interrupted in their longitudinal direction by regions where the drift layer is not etched. This can reduce manufacturing challenges in regions like the centre of the transistor cell where, for example, two trench recesses must cross each other.

A further embodiment is shown in FIG. 10 for a polygon shape cell layout, where a plurality of trench recesses is formed and arranged in a ladder pattern. It may be appreciated that in this embodiment, the transistor cells illustrated in FIG. 10 may bring further advantages compared to other transistor cell shapes, in terms of increased channel width of the vertical MOS channels (16).

A further embodiment is shown in FIG. 11 for a square shape cell layout, wherein the trench recesses are laid out to provide a 45° angle between their longitudinal direction and the plane of the planar regions (i.e. the two trench recesses are formed along the tow diagonals of the square cell shape). The transistor cells each include a contact opening (14) disposed beside (e.g., next to or adjacent to) the source regions (7). The contact openings are disposed along all or fewer than the four smaller regions formed by the two intersecting trench recesses. It may be appreciated that in this embodiment, the square cells illustrated in FIG. 11 may offer additional advantages over other transistor cell shapes in terms of increased channel width of the vertical MOS channels (16) depicted in FIG. 8 or 9.

Further inventive transistor cell layout embodiments are shown in FIGS. 12 and 13. In FIG. 12, two parallel trench recesses are formed at two opposite sides of the transistor cell. Situated in the polygonal opening of the first gate electrode layer (10), and orthogonal to the two parallel trench recesses, there is formed an additional trench recess having a contact opening (14) on each side. In FIG. 13, two additional orthogonal trench recesses are formed, but more than two trench recesses can also be formed depending on the dimensions of the transistor cell.

In the embodiments of FIGS. 10 and 13, it is not needed for all parallel trench recesses to be equally spaced from each other. Furthermore, the crossing of the trench recesses creates separate cell sub-areas in a top plane view (i.e. 4 distinct sub-areas in FIG. 7A, 8 distinct sub-areas in FIG. 10, and 3 distinct sub-areas in FIG. 13). According to another embodiment of the invention, the source regions may not be present in all these cell sub-areas. Similarly, contact openings (14) may not be present in all these cell sub-areas, depending on the trade-off required to achieve certain device performance criteria.

A seventh embodiment is shown in FIG. 14A, wherein the first base layer (9) extends uniformly on the top of, and substantially overlaps the drift layer (4) in the regions under the first planar gate electrode (10). In this case, although an inversion layer can be formable in the first base layer (9) regions under the first gate electrode (10), a planar MOS channel (15) is not formable in the traditional understanding, as the drift layer (4) is not directly connected to this inversion layer on the emitter side. Instead, the majority charge carriers will flow on the side trench walls of the second gate electrodes (11) as depicted in FIG. 14B.

In an eighth embodiment, shown in FIG. 15 as a cross section through the transistor cell, the second base layer (8) may be laterally extending to abut the insulating layer (12'). In this case, as the P type doping of the second base layer (8) is higher than the P type doping of the first base layer (9), a vertical MOS channel (16) is not formable when a voltage is applied on the second gate electrode (12'), while the same voltage applied on the first gate electrode (10) will still form a planar MOS channel (15).

In all the embodiments described above, the trench recesses embedding the second gate electrodes (11), will extend vertically into the drift layer (4) to a depth approximately in a range from about 2 µm to about 10 µm. Additionally, the width of the trenches may range from about 3 µm to about 0.5 µm. Alternatively, it may also be possible that the trench recesses embedding the second gate electrodes (11) are etched shallower than the depth of the first base layer (9), or that the first base layer (9) is formed at a greater depth than the depth of the said trench recesses.

It is possible to apply the invention to semiconductor devices, in which the conductivity type of all layers is reversed, i.e. with a lightly P-doped substrate. or in which the substrate is formed of a wide bandgap semiconductor material such as SiC, GaN, Gallium Oxide, ZnO, Aluminium Oxide, Diamond, etc.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

REFERENCE LIST

1: inventive transistor cell of a power semiconductor device
2: collector metallization (electrode)
21: collector side
3: emitter metallization (electrode)
31: emitter side
4: drift layer, substrate
5: buffer layer
6: collector layer
7: source layer
8: second base layer
9: first base layer
10: planar gate electrode, electrically conductive layer
10': uncovered trench gate electrode
11: trench gate electrode, electrically conductive layer
12: insulating gate oxide for planar gate
12': insulating gate oxide for trench gate
13: insulation layer for planar cell and trench cell
14: emitter contact opening
15: horizontal MOS channel for planar gate
16: vertical MOS channel for trench gate
17: enhancement layer
100: planar MOS cell power semiconductor device (prior art)
101: planar MOS cell power semiconductor device with enhancement layer (prior art)
200: trench MOS cell power semiconductor device (prior art)
202: trench MOS cell power semiconductor device (prior art)
300: trench planar MOS cell power semiconductor device (prior art)

The invention claimed is:

1. A semiconductor device with, multiple polygon shaped transistor cells disposed at a first surface of a silicon, silicon carbide (SiC), or a wide bandgap semiconductor substrate, with the first surface and a second surface opposite to each other in a first dimension of three orthogonal dimensions, wherein an emitter electrode is operatively connected to the first surface and a collector electrode is operatively connected to the second surface, comprising:
a drift layer having a first conductivity type located between the first surface and the second surface, and having a first doping concentration;
a first base layer of a second conductivity type, extending into the drift region, and having a second doping concentration;
one or more source regions of the first conductivity type operatively connected to the emitter electrode, with a third doping concentration greater than the first doping concentration, and disposed at the surface of the drift region, surrounded by the first base layer;
a first planar gate electrode with a polygon shaped opening formed of a heavily doped polycrystalline layer or a metal-containing layer, and arranged at the surface of the drift layer;
a second base layer of the second conductivity type located within the first base layer and extending towards the second surface below the source region, having a fourth doping concentration greater than the second doping concentration, and having at least a region/point operatively connected to the emitter electrode via a contact opening; and
one or more second trench gate electrodes of a heavily doped polycrystalline layer or a metal-containing layer, wherein the one or more second trench gate electrodes are embedded in corresponding trench recesses arranged on the first surface;
wherein the first gate electrode is electrically insulated from the first base layer, the source region and the drift layer by a first insulating layer;
wherein each of the second trench gate electrodes is electrically insulated from the first base layer, second base layer, source region and the drift layer by a second insulating layer;
wherein the polygon shape of the transistor cells and of the opening in the first planar gate electrodes is one of square, rectangle, circle, hexagon, and octagon;
wherein at least one second trench gate electrode abuts on a source region and extends deeper into the drift layer than the first base layer, and a vertical channel is formable between the emitter electrode, the source region, the first base layer and the drift layer;
wherein the longitudinal directions of the second trench gate electrodes are parallel to the sides or diagonals of the polygon shape of the transistor cell; and
wherein the said second trench gate electrodes have at least one of the following features:
formed parallel to sides of the polygon shape of the transistor cell, and intersecting at the center of the transistor cell, or
formed along the diagonals of the polygon shape of the transistor cell, and intersecting at the center of the transistor cell, or
formed such that at least one second gate electrode is perpendicular to the other trench gate electrodes.

2. A semiconductor device according to claim 1, wherein the polygon shape of the transistor cell is a rectangle, and three or more second trench gate electrodes are formed parallel to the sides of the rectangle; characterized in that, at least one of the second trench gate electrodes is orthogonal to the other second trench gate electrodes forming a ladder pattern that divides the surface of the transistor cell into multiple sub-areas.

3. A semiconductor device according to claim 2, wherein each of the sub-areas of the transistor cell is identical in size, and contains a portion of the source region and a contact opening.

4. A semiconductor device according to claim 2, wherein the sub-areas of the transistor cell are different in size, and contain no portions of the source region, or no contact openings.

5. A semiconductor device according to claim 1, wherein a portion of the second base layer extends under the source regions to abut the second insulating layer; a vertical MOS channel is not formable between the emitter electrode, the source region, the first base layer and the drift layer.

6. A semiconductor device according to claim 1, wherein one or more layers of the transistor cell are at least partially misaligned or misshaped due to manufacturing imperfections.

7. A semiconductor device according to claim 1, wherein one or more of the second gate electrodes of the same transistor cell are formed in trench recesses interrupted along their longitudinal directions by un-etched regions of the drift layer.

8. A semiconductor device according to claim 1, wherein the transistor cell comprises a field effect transistor (FET), an insulated gate bipolar transistor (IGBT), insulated base MOS-controlled thyristor (IBMCT), a junction field effect transistor (JFET), or a metal-semiconductor field effect transistor (MESFET).

9. A semiconductor device according to claim 1, wherein the first planar gate electrode and the plurality of second trench gate electrodes are electrically connected at the crossing points thereof.

10. A semiconductor device according to claim 1, wherein at least a portion of the plurality of second gate electrodes are electrically connected to the emitter electrode.

11. A semiconductor device according to claim 1, wherein at least a portion of the plurality of second gate electrodes are electrically floating.

12. A semiconductor device according to claim 1, wherein an enhancement layer of the first conductivity type is arranged between the drift layer and the first base layer.

13. A semiconductor device according to claim 1, comprising:
a reverse conducting type device with a shorted collector layer arranged at the second main side between the second main electrode and the buffer layer, wherein the shorted collector layer is formed by a pattern of alternating first and second conductivity type regions.

14. A semiconductor device according to claim 1, wherein the first planar gate electrode is electrically grounded.

15. A semiconductor device according to claim 1, wherein the first planar gate electrode is omitted.

16. Semiconductor module package comprising at least one semiconductor device according to claim 1.

17. Converter with a plurality of semiconductor devices according to claim 1.

* * * * *